United States Patent
Suzuki

(10) Patent No.: US 7,641,988 B2
(45) Date of Patent: Jan. 5, 2010

(54) SELF-SUPPORTED NITRIDE SEMICONDUCTOR SUBSTRATE AND ITS PRODUCTION METHOD, AND LIGHT-EMITTING NITRIDE SEMICONDUCTOR DEVICE USING IT

(75) Inventor: Takayuki Suzuki, Tokyo (JP)

(73) Assignee: Hitachi Cable, Ltd., Tokyo (JP)

( * ) Notice: Subject to any disclaimer, the term of this patent is extended or adjusted under 35 U.S.C. 154(b) by 36 days.

(21) Appl. No.: 10/821,957

(22) Filed: Apr. 12, 2004

(65) Prior Publication Data

US 2005/0161772 A1   Jul. 28, 2005

(30) Foreign Application Priority Data

Jan. 27, 2004   (JP) .............. 2004-018884

(51) Int. Cl.
*B32B 9/00* (2006.01)
*B32B 19/00* (2006.01)
*C30B 19/00* (2006.01)
*C30B 23/00* (2006.01)
*C30B 25/00* (2006.01)

(52) U.S. Cl. .................. 428/698; 117/58; 117/85; 117/95; 117/952

(58) Field of Classification Search ............... 428/220, 428/698; 117/952
See application file for complete search history.

(56) References Cited

U.S. PATENT DOCUMENTS

| | | | |
|---|---|---|---|
| 5,770,887 A | 6/1998 | Tadatomo et al. | |
| 5,810,925 A * | 9/1998 | Tadatomo et al. | ............. 117/90 |
| 6,001,748 A | 12/1999 | Tanaka et al. | |
| 6,040,588 A * | 3/2000 | Koide et al. | ................... 257/15 |
| 6,252,261 B1 * | 6/2001 | Usui et al. | ................... 257/190 |
| 6,407,409 B2 * | 6/2002 | Cho et al. | ...................... 257/78 |
| 6,420,733 B2 * | 7/2002 | Koide et al. | ................... 257/79 |
| 2002/0096674 A1 | 7/2002 | Cho et al. | |

FOREIGN PATENT DOCUMENTS

| | | |
|---|---|---|
| JP | 07-165498 | 6/1995 |
| JP | 10-053495 | 2/1998 |

OTHER PUBLICATIONS

"High Quality Growth of AlN Epitaxial Layer by Plasma-Assisted Molecular-Beam Epitaxy" by Kulandaivel Jeganathan, Toshio Kitamura, Mitsuaki Shimizu and Hajime Okumura; Japan Journal of Applied Physics; vol. 41, 2002; pp. L28-L30 Part 2, No. 1A/B, Jan. 15, 2002.*

Syunji Imanaga, et al.: Performance of AlN/GaN Heterostructure Metal Insultor Semiconductor Field Effect Transistor Based on Two-dimensional Monte Carlo Simulation; Jpn J. Appl. Phys. vol. 39 (2000)pp. 1678-1682; Part 1, No. 4A, Apr. 2000.

* cited by examiner

Primary Examiner—Timothy M Speer
Assistant Examiner—Jonathan C Langman
(74) Attorney, Agent, or Firm—Sughrue Mion, PLLC

(57) ABSTRACT

A self-supported nitride semiconductor substrate of 10 mm or more in diameter having an X-ray diffraction half width of 500 seconds or less in at least one of a {20-24} diffraction plane and a {11-24} diffraction plane.

8 Claims, 2 Drawing Sheets

US 7,641,988 B2

SELF-SUPPORTED NITRIDE SEMICONDUCTOR SUBSTRATE AND ITS PRODUCTION METHOD, AND LIGHT-EMITTING NITRIDE SEMICONDUCTOR DEVICE USING IT

FIELD OF THE INVENTION

The present invention relates to a self-supported nitride semiconductor substrate for use in light-emitting devices having large light emission with a low driving voltage, a method for producing such a self-supported nitride semiconductor substrate, and a light-emitting nitride semiconductor device formed by using such a self-supported nitride semiconductor substrate.

BACKGROUND OF THE INVENTION

Because the crystal growth of nitride semiconductors in a bulk form from its melt is generally difficult, a self-supported nitride semiconductor substrate is obtained by growing nitride semiconductor layer on a different base substrate such as sapphire and gallium arsenide, and removing layers ranging from the base substrate to leave the nitride semiconductor layer only.

The formation of a nitride semiconductor layer on a different base substrate of sapphire, etc. with large lattice mismatch is usually achieved not by the epitaxial growth of a nitride semiconductor coherent with the lattice of the base substrate, but by growing crystal nuclei in many points on the base substrate to such an extent that they are integrated to a continuous film. Accordingly, a film obtained by integrating such nitride semiconductor crystals does not have a lattice plane completely parallel to that of the substrate (not completely flat surface), resulting in slight deviations of crystal orientations therebetween. It is common to use a diffraction half width determined by an X-ray diffraction method as a method for evaluating crystal quality such as the deviations of crystal orientations, etc.

The quality of nitride semiconductor substrates is conventionally evaluated by a half width of an X-ray rocking curve in a {0002} or {0004} diffraction plane, and the smaller the half width, the higher the quality of the nitride semiconductor. For instance, Japanese patent 3,184,717 discloses a GaN single crystal as thick as 80 μm or more having a half-width of 5 to 250 seconds in a two-crystal X-ray rocking curve, which serves as a substrate, on which a GaN semiconductor crystal layer is grown. JP 10-053495 A discloses a nitride single crystal of 10 mm or more in both length and width and 300 μm or more in thickness, or 20 mm or more in length and 10 μm or more in diameter, which has a half width of 5 minutes or less in an X-ray diffraction rocking curve.

OBJECTS OF THE INVENTION

However, it has been found that even self-supported nitride semiconductor substrates having an X-ray diffraction half width in a {0002} symmetric diffraction plane are as small as, for instance, 250 seconds or less, some light-emitting devices such as LEDs formed thereon exhibit only low brightness. Namely, the conventional evaluation standards do not necessarily secure the formation of self-supported nitride semiconductor substrates for producing light-emitting devices capable of providing high emission power at low driving voltage.

Accordingly, an object of the present invention is to provide a self-supported nitride semiconductor substrate for producing light-emitting devices capable of providing high emission power at low driving voltage.

Another object of the present invention is to provide a method for producing such a self-supported nitride semiconductor substrate.

A further object of the present invention is to provide a light-emitting device using such a self-supported nitride semiconductor substrate.

SUMMARY OF THE INVENTION

As a result of intense research in view of the above objects, the inventor has paid attention to the fact that X-ray diffraction half widths of {20-24} and {11-24} diffraction planes are proper as an evaluation standard replacing the half width of X-ray rocking curves of {0002} and {0004} symmetric diffraction planes, finding that when any one of them is 500 seconds or less, it is possible to obtain a self-supported nitride semiconductor substrate for producing light-emitting devices capable of providing high emission power at low driving voltage. The present invention has been achieved based on this finding.

Thus, the self-supported nitride semiconductor substrate of the present invention has an X-ray diffraction half width of 500 seconds or less in at least one of a {20-24} diffraction plane and a {11-24} diffraction plane, and a diameter of 10 mm or more. In this self-supported nitride semiconductor substrate, the nitride semiconductor is preferably undoped, or n- or p-type, and preferably has a carrier density of $1 \times 10^{20}$ $cm^{-3}$ or less.

The method of the present invention for producing the above self-supported nitride semiconductor substrate comprises (1) forming a first nitride semiconductor layer having a dislocation density of $10^n/cm^2$ ($0 < n \leq 10$) on a base substrate; (2) forming a mask layer made of another material than the nitride semiconductor on the first nitride semiconductor layer; (3) providing the mask layer with openings having an area of $10^{-n}$ $cm^2$ or less, which penetrate the mask layer in a thickness direction, at a density of $10^{-2}/cm^2$ or less; (4) forming a second nitride semiconductor layer having a thickness of 50 μm or more on the mask layer; and (5) removing layers ranging from the base substrate to the mask layer. The openings of the mask layer preferably has a density of $10^{n-4}/cm^2$ or less.

The growing of the nitride semiconductor is preferably carried out by a sublimation method, a metal-organic vapor phase epitaxy method, a hydride vapor-phase epitaxy method, liquid-phase epitaxy method or a combination thereof. The base substrate may be made of a different material from that of the self-supported substrate.

In the production of the self-supported nitride semiconductor substrate, the first nitride semiconductor layer may be formed on the base substrate via a buffer layer.

The light-emitting nitride semiconductor device of the present invention comprises an epitaxial nitride layer with a light-emitting device structure formed on the above self-supported nitride semiconductor substrate.

DETAILED DESCRIPTION OF THE PREFERRED EMBODIMENTS

The self-supported nitride semiconductor substrate of the present invention has an X-ray diffraction half width of 500 seconds or less in at least one of a {20-24} diffraction plane and a {11-24} diffraction plane. The term "self-supported substrate" used herein means a substrate having such strength that is not only enough to maintain its shape but also suitable for handling. To have such strength, the self-supported substrate may have a thickness of 50 µm, preferably 200 µm or more. To make the cleavage easy after the formation of devices, the self-supported substrate preferably has a thickness of 1 mm or less. When the self-supported substrate is too thick, the cleavage is difficult, resulting in a rough cleavage surface. If the self-supported substrate with a rough cleavage surface were used to produce semiconductor lasers, etc., they would have deteriorated characteristics due to reflection loss.

Figure 1:
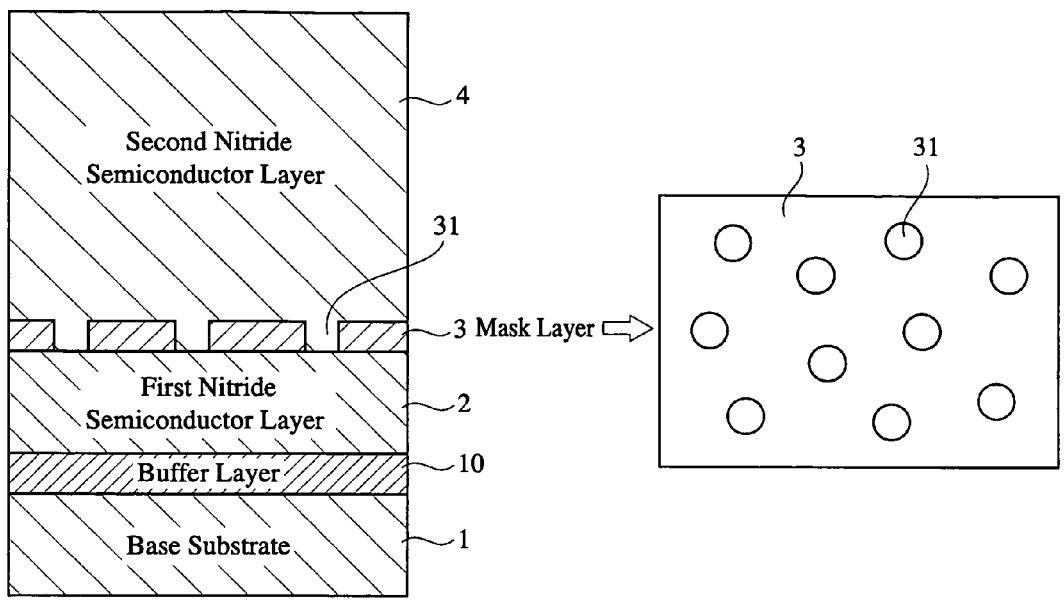
FIG. 1 is a schematic cross-sectional view showing the structure of layers formed on a base substrate for producing a self-supported nitride semiconductor substrate, the layers including a mask layer having openings penetrating in a thickness direction.

The nitride semiconductor in the self-supported nitride semiconductor substrate of the present invention may be grown by various methods such as a sublimation method, a metal-organic vapor phase epitaxy (MOVPE) method, a hydride vapor-phase epitaxy (HVPE) method, a liquid-phase epitaxy method, an epitaxial lateral overgrowth (ELO) method, or a combination thereof, and the ELO method is particularly preferable. In the ELO method, as shown in FIG. 1, a first nitride semiconductor layer 2 and a mask layer 3 are formed on a base substrate 1 in this order, and after providing the mask layer 3 with pluralities of openings 31 of desired size penetrating the mask layer 3 in a thickness direction, a second nitride semiconductor layer 4 is formed on the mask layer 3. Finally, the base substrate 1, the first nitride semiconductor layer 2 and the mask layer 3 are removed. Each step will be explained in detail below.

Materials usable for the base substrate 1 for growing the nitride semiconductor layers 2, 4 are sapphire, silicon carbide, silicon, gallium arsenide, etc. However, the base substrate 1 made of these materials does not have good matching in a lattice constant with the nitride semiconductors 2, 4. Accordingly, it is preferable to form a buffer layer 10 on the base substrate 1, and then epitaxially grow the nitride semiconductor layers 2, 4 on the buffer layer. The buffer layer 10 may be a layer of GaN or AlN formed at about 500° C.

It is preferable that the first nitride semiconductor layer 2 formed on the buffer layer 10 is undoped with impurities, or n- or p-type, and has a carrier density of $1 \times 10^{20}$ cm$^{-3}$ or less. When the carrier density exceeds $1 \times 10^{20}$ cm$^{-3}$, the concentration of n- or p-type impurities becomes too high, resulting in the deteriorated quality of the nitride semiconductor crystal.

The first nitride semiconductor layer 2 may be the same as the second nitride semiconductor layer 4, which is used as a self-supported nitride semiconductor substrate. These nitride semiconductor layers 2, 4 may be formed by a sublimation method, a metal-organic vapor phase epitaxy method, a hydride vapor-phase epitaxy method, a liquid-phase epitaxy method or a combination thereof. The first nitride semiconductor layer 2 preferably has a thickness of about 0.1 to 500 µm. The dislocation density of the first nitride semiconductor layer 2 is represented by $10^n$ per cm$^2$ ($0 < n \leq 10$), for the convenience of explanation.

The mask layer 3 formed on the first nitride semiconductor layer 2 is preferably made of materials such as high-melting point metals bearable at the growth temperature of a nitride semiconductor, or those having low wettability to the nitride semiconductor, such as SiN, TiN, SiO$_2$, etc. The growth of a nitride semiconductor on the low-wettability mask layer 3 makes it possible to suppress the generation of crystal nuclei in other areas than the openings 31 in a thickness direction, thereby minimizing the deviation of crystal orientation, which would occur when crystal nuclei merge.

Though not particularly restrictive, the mask layer 3 is effectively provided with openings 31 by photolithography or selective etching, etc. The shapes of the openings 31 are not restrictive. Each opening 31 preferably has an area corresponding to a reciprocal ($10^{-n}$ cm$^2$) of the dislocation density of an underlying crystal layer (first nitride semiconductor layer 2) or less, more preferably $10^{-n-2}$ cm$^2$ or less. In a case where the first nitride semiconductor layer 2 has a high dislocation density (n is large), the number of dislocations penetrating through the openings 31 from the first nitride semiconductor layer 2 can be suppressed by narrowing the openings 31. The lower limit of the area of the opening 31 is preferably about $10^{-10}$ cm$^2$, taking into consideration the growth speed of nitride semiconductor crystal nuclei, the deviation of crystal orientation, the difficulty of forming openings, etc.

The number (density) of the openings 31 formed per a unit area of the mask layer 3 corresponds to the density of nitride semiconductor crystal nuclei generating thereon. When the crystal nuclei grow and merge with each other to form a continuous film, a slight deviation of crystal orientation tends to generate defects such as new dislocation, etc. Accordingly, the density of the openings 31 is preferably as small as possible. Also, taking into consideration the resistance to failure of the mask layer 3, etc., the total area of the openings 31 should be sufficiently smaller than the total area of the mask layer 3. Accordingly, the density of the openings 31 is preferably $10^{n-2}$/cm$^2$ or less, more preferably $10^{n-4}$/cm$^2$ or less. It should be noted, however, that when the density of the openings 31 is too low, the merger of crystal nuclei growing through the openings 31 takes too much time, so that the second nitride semiconductor layer 4 needs too much thickness for obtaining a nitride semiconductor layer with a low dislocation density. Accordingly, the lower limit of the density of the openings 31 is preferably about $10^2$ of openings per cm$^2$.

The thickness of the mask layer 3 having such a structure is preferably about 0.01 to 10 µm. When the thickness of the mask layer 3 is less than 0.01 µm, the ELO method fails to provide sufficient effects. On the other hand, when the mask layer 3 is thicker than 10 µm, it takes too much time to for nitride semiconductor crystal nuclei to pass through the openings 31.

The second nitride semiconductor layer 4 grown on the mask layer 3 may have a different composition from that of the first nitride semiconductor layer 2. The carrier density of the second nitride semiconductor layer 4 is preferably in a range of $1 \times 10^{20}$ cm$^{-3}$ or less. When the carrier density of the second nitride semiconductor layer 4 is more than $1 \times 10^{20}$ cm$^{-3}$, the concentration of n- or p-impurities is too high, resulting in a self-supported nitride semiconductor substrate with deteriorated quality.

The second nitride semiconductor layer 4 may be formed by a sublimation method, a metal-organic vapor phase epitaxy method, a hydride vapor-phase epitaxy method, a liquid-phase epitaxy method, or a combination thereof. The second nitride semiconductor layer 4 is turned to a self-supported substrate by mirror-polishing after removing layers ranging from the base substrate 1 to the mask layer 3 (for instance, the base substrate 1, the buffer layer 10, the first nitride semiconductor layer 2 and the mask layer 3 in FIG. 1). Thus, the second nitride semiconductor layer 4 is designed to have such a thickness as to be 50 μm or more, preferably 200 μm or more after polishing. Also, taking into consideration the easiness of cleavage, etc. after the formation of devices, the thickness of the second nitride semiconductor layer 4 after polishing is preferably 1 mm or less.

After the formation of the second nitride semiconductor layer 4, layers ranging from the base substrate 1 to the mask layer 3 are removed by grinding, dissolving (wet etching), dry etching, etc. The resultant self-supported nitride semiconductor substrate is preferably mirror-polished on both surfaces. This is because if a crystal substrate had a rough surface, a crystal epitaxially grown thereon would also have a rough surface despite that the substrate is an ideal crystal with a low dislocation density, resulting in drastic decrease in the yield of devices in their production process, particularly at a photolithography step.

The nitride semiconductor usable in the present invention is not restricted, and it may be represented, for instance, by the general formula: In$_x$Ga$_y$Al$_{1-x-y}$N, wherein $0 \leq x \leq 1$, $0 \leq y \leq 1$, and $0 \leq x+y \leq 1$. A p-type GaN properly doped with Mg, etc. may also be used.

Because a nitride semiconductor layer having less lattice defects can be grown on the self-supported nitride semiconductor substrate of the present invention, epitaxial wafers for high-performance devices such as LEDs, LDs, light-receiving devices can be formed. Particularly, light-emitting devices such as LEDs and LDs formed by using the self-supported nitride semiconductor substrate of the present invention provide high emission power at a low driving voltage.

The present invention will be described in detail referring to Examples below without intention of limiting the present invention thereto.

REFERENCE EXAMPLE 1

Figure 2:
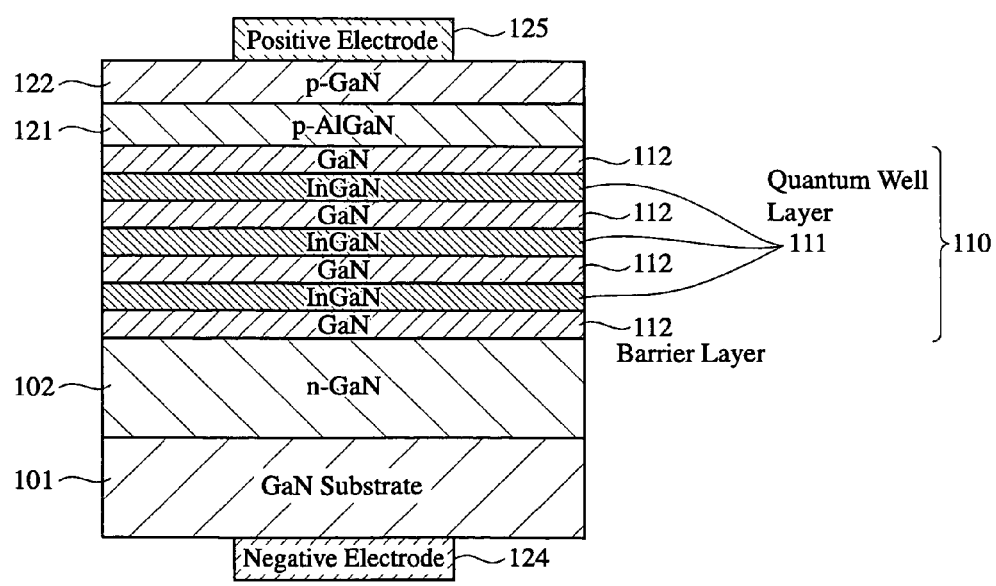
FIG. 2 is a schematic cross-sectional view showing the structure of the light-emitting nitride semiconductor device of the present invention.

To prove that even a light-emitting diode (LED) formed by using a GaN substrate having a small X-ray diffraction half width of a {0002} symmetric diffraction plane often has low brightness, each self-supported GaN substrate of Samples 1 to 9 was produced to form an LED shown in FIG. 2.

Each Sample of the self-supported GaN substrate was produced as follows. After forming a GaN buffer layer and a GaN layer on a 2-inch-diameter sapphire substrate, the sapphire substrate and the GaN buffer layer were removed. The resultant GaN substrate was polished on both surfaces to provide a 270-μm-thick self-supported GaN substrate. The formation of a GaN buffer layer and a GaN layer was conducted for each Sample with different production conditions of a heating temperature, etc.

The structure of LED formed on each self-supported GaN substrate was the same as in Example 8 below. Table 1 shows the relation between an X-ray diffraction half width of a (0002) plane of each self-supported GaN substrates of Samples 1 to 9 and the emission power of LED produced by using each self-supported GaN substrate. It is clear from Table 1 that even LEDs produced by using GaN substrates with a small X-ray diffraction half width of a (0002) plane do not necessarily provide high emission power.

TABLE 1

| Sample No. | Diffraction Half Width of (0002) Plane (seconds) | Emission Power (mW) |
| --- | --- | --- |
| 1 | 47 | 4.0 |
| 2 | 48 | 6.0 |
| 3 | 64 | 1.8 |
| 4 | 98 | 2.4 |
| 5 | 138 | 2.6 |
| 6 | 142 | 4.8 |
| 7 | 164 | 2.0 |
| 8 | 248 | 1.4 |
| 9 | 267 | 3.8 |

EXAMPLE 1

A tubular reaction vessel made of quartz comprising a halogen gas supply tube and an N source supply tube was provided with a quartz boat containing a Ga metal at a position close to the halogen gas supply tube, and a 2-inch-diameter sapphire base substrate 1 fixing to a holder perpendicular to the reaction tube at a position separate from the quartz boat and close to the N source supply tube.

With the quartz boat containing a Ga metal heated at 900° C. and the sapphire base substrate 1 heated at 510° C., introduced into the tubular reaction vessel was an HCl gas together with a hydrogen carrier gas via the halogen gas tube, and an ammonia gas together with a nitrogen carrier gas via the N source supply tube. The HCl gas was reacted with Ga to form GaCl. Using the reaction of GaCl and NH$_3$, a GaN buffer layer was grown to a thickness of 30 nm.

With the base substrate 1 having the GaN buffer layer formed thereon heated to 1050° C., a GaN crystal was grown from GaCl and ammonia as source gases at a rate of 24 μm/hr for 10 minutes, to form a first undoped GaN layer 2 having a thickness of 4 μm. The dislocation density of the first GaN layer 2 was about 10$^9$ per cm$^2$. A wafer was then taken out of the tubular reaction vessel. An SiO$_2$ film was formed as a mask layer 3 on the first GaN layer 2, and provided with openings 31 having an area of 0.1 μm$^2$ at a density of 10$^7$ per cm$^2$ by photolithography.

The resultant wafer was fixed to a holder in an HVPE apparatus. With the quartz boat containing a Ga metal heated at 900° C. and the wafer heated at 1050° C., supplied to the HVPE apparatus was an HCl gas together with a hydrogen carrier gas via the halogen gas tube, and an ammonia gas together with a nitrogen carrier gas via the N source supply tube. An HCl gas was react with Ga to generate GaCl. By the reaction of GaCl and NH$_3$, GaN was grown on the SiO$_2$ film 3 at a rate of 100 μm/hr for 3 hours to form a second GaN layer 4 having a thickness of 300 μm. The wafer thus obtained had a structure shown in FIG. 1.

The wafer having the second GaN layer 4 formed thereon was taken out of the tubular reaction vessel, and the sapphire base substrate 1 to the SiO$_2$ film 3 were removed by lapping and polishing using a diamond polishing agent to provide a 300-μm-thick, self-supported GaN substrate. The self-supported GaN substrate thus obtained was free from cracks, etc. after any of growing and grinding.

X-ray was generated at 40 kV and 45 mA using a CuKα$_1$ as an X-ray source, to measure X-ray diffraction half widths of a (20-24) plane and a (11-24) plane of the self-supported GaN substrate. As a result, they were 278 seconds and 286 seconds, respectively. It is clear from these results that the self-supported GaN substrate of this Example has excellent crystallinity.

It was found by secondary ion mass spectrometry (SIMS) that this self-supported GaN substrate contained about $5 \times 10^{17}$ of Si per $cm^3$ as impurity, and that the content of Mg was less than the detection limit. It is presumed that Si was introduced from HCl as a source gas and from the tubular reaction quartz vessel.

COMPARATIVE EXAMPLE 1

A self-supported GaN substrate was produced in the same manner as in Example 1 except for growing a second GaN layer 4 doped with Si in a proportion of $2 \times 10^{20}$ per $cm^3$. The X-ray diffraction half widths of a (20-24) plane and a (11-24) plane of GaN were 550 and 568 seconds, respectively, proving that this self-supported GaN substrate had extremely poorer crystallinity than that of the self-supported GaN substrate of Example 1.

COMPARATIVE EXAMPLE 2

A self-supported GaN substrate was produced in the same manner as in Example 1 except for growing a second GaN layer 4 doped with Mg in a proportion of $2 \times 10^{20}$ per $cm^3$. The X-ray diffraction half widths of a (20-24) plane and a (11-24) plane of GaN were 820 and 845 seconds, respectively, proving that this self-supported GaN substrate had extremely poorer crystallinity than that of the self-supported GaN substrate of Example 1.

EXAMPLE 2

A self-supported GaN substrate was produced in the same manner as in Example 1 except for using a GaAs base substrate in place of the sapphire base substrate. The X-ray diffraction half widths of a (20-24) plane and a (11-24) plane of GaN were 322 and 336 seconds, respectively, proving that this self-supported GaN substrate had relatively good crystallinity, though slightly poorer than that of Example 1.

EXAMPLE 3

A 2-inch-diameter sapphire (C plane) base substrate 1 was set in a tubular reaction vessel of an MOVPE apparatus. After the inside of the vessel was substituted with hydrogen, the temperature of the base substrate 1 was elevated to 1050° C. while flowing hydrogen, to conduct the cleaning of the base substrate 1. The temperature of the base substrate 1 was then lowered to 510° C., and a 30-nm-thick GaN buffer layer was formed on the base substrate 1 using hydrogen as a carrier gas and TMG and ammonia as source gases.

Elevating the substrate temperature to 1050° C., and using TMG and ammonia as source gases, a GaN crystal was grown at a speed of 4 μm/hr for 1 hour to form a first non-doped GaN layer 2 having a thickness of 4 μm. The first GaN layer 2 had a dislocation density of about $1 \times 10^8 / cm^2$.

After the formation of the first GaN layer, the wafer was taken out of the tubular reaction vessel, and an $SiO_2$ film was formed on the first GaN layer, and provided with openings having an area of 1 μm$^2$ at a density of $1 \times 10^6 / cm^2$ by photolithography.

The resultant wafer was introduced into an HVPE apparatus, and fixed to a holder. With a quartz boat containing a Ga metal heated at 900° C. and the wafer heated at 1050° C., supplied to the HVPE apparatus were an HCl gas together with a hydrogen carrier gas via a halogen gas tube, and an ammonia gas together with a nitrogen carrier gas via an N source supply tube near the sapphire base substrate 1. The HCl gas was reacted with Ga to form GaCl, and a GaN crystal was grown by the reaction of GaCl and ammonia at a speed of 100 μm/hr for 3 hours, to form a second GaN layer 4 having a thickness of 300 μm.

The sapphire base substrate 1 to the $SiO_2$ film 3 were removed by lapping and polishing in the same manner as in Example 1 to obtain a 300-μm-thick, self-supported GaN substrate. The X-ray diffraction half widths of a (20-24) plane and a (11-24) plane of this self-supported GaN substrate were 120 and 136 seconds, respectively. This proves that a self-supported GaN substrate with good crystallinity was obtained.

EXAMPLE 4

A self-supported GaN substrate was produced in the same manner as in Example 3 except that the second GaN layer 4 was grown using a TiN film in place of an $SiO_2$ film. The X-ray diffraction half widths of a (20-24) plane and a (11-24) plane of this self-supported GaN substrate were 102 and 104 seconds, respectively, proving that a self-supported GaN substrate having better crystallinity than that of Example 3 was obtained.

EXAMPLE 5

A self-supported GaN substrate was produced in the same manner as in Example 3 except that the second GaN layer 4 was grown using a Mo film in place of the $SiO_2$ film. The X-ray diffraction half widths of a (20-24) plane and a (11-24) plane of this self-supported GaN substrate were 203 and 211 seconds, respectively, proving that a self-supported GaN substrate having better crystallinity than that of Example 1 was obtained.

EXAMPLE 6

A quartz boat containing a Ga metal was disposed in a tubular reaction vessel made of quartz comprising a halogen gas supply tube and an N source supply tube, at a position close to the halogen gas supply tube, and a 2-inch-diameter sapphire base substrate 1 perpendicular to the reaction tube was fixed to a holder at a position separate from the quartz boat and close to the N source supply tube.

With the quartz boat containing a Ga metal heated at 900° C. and the sapphire base substrate 1 heated at 510° C., supplied to the reaction vessel were an HCl gas together with a hydrogen carrier gas via the halogen gas tube, and an ammonia gas together with a nitrogen carrier gas via the N source supply tube. The HCl gas was reacted with Ga to form GaCl. A GaN buffer layer was grown by the reaction of GaCl and $NH_3$ to a thickness of 30 μnm on the sapphire base substrate 1.

With the temperature of the base substrate 1 having the buffer layer formed thereon elevated to 1050° C., a GaN crystal was grown at a speed of 100 μm/hr for 2 hours using the formed GaCl and ammonia as source gases, to form a first non-doped GaN layer 2 having a thickness of 200 μm. The first GaN layer 2 had a dislocation density of about $1 \times 10^6 / cm^2$.

After the growth of the first GaN layer 2, the wafer was taken out of the reaction vessel. After the formation of an $SiO_2$ film 3 on the first GaN layer 2, the SiO$_2$ film 3 was provided with openings 31 having an area of 10 μm$^2$ at a density of 1×10$^4$/cm$^2$ by photolithography.

The resultant wafer was fixed to a holder in the HVPE apparatus. With the quartz boat containing a Ga metal heated at 900° C. and the wafer heated at 1050° C., supplied to the HVPE apparatus were an HCl gas together with a hydrogen carrier gas via the halogen gas tube, and an ammonia gas together with a nitrogen carrier gas via the N source supply tube. The HCl gas was reacted with Ga to form GaCl. GaN was grown on the SiO$_2$ film 3 by the reaction of GaCl and NH$_3$ at a speed of 100 μm/hr for 3 hours, to form a second GaN layer 4 having a thickness of 300 μm.

The sapphire base substrate 1 to the SiO$_2$ film 3 were removed by lapping and polishing in the same manner as in Example 1, to obtain a self-supported GaN substrate having a thickness of 300 μm. The X-ray diffraction half widths of a (20-24) plane and a (11-24) plane of this self-supported GaN substrate were 50 and 67 seconds, respectively. This proves that a self-supported GaN substrate with good crystallinity was obtained.

EXAMPLE 7

A self-supported GaN substrate was produced in the same manner as in Example 6 except that a second GaN layer 4 was formed with the density of the openings 31 of the SiO$_2$ film 3 changed from 1×10$^4$/cm$^2$ to 1×10$^3$/cm$^2$. The X-ray diffraction half widths of a (20-24) plane and a (11-24) plane of this self-supported GaN substrate were 26 and 32 seconds, respectively. This proves that a self-supported GaN substrate with good crystallinity was obtained.

Table 2 shows the measurement results of the X-ray diffraction half widths of the self-supported GaN substrates in a (20-24) plane and a (11-24) plane in Examples 1 to 7 and Comparative Examples 1, 2.

TABLE 2

| | X-Ray Diffraction Half Width (second) | |
| --- | --- | --- |
| No. | (20-24) Plane | (11-24) Plane |
| Example 1 | 278 | 286 |
| Example 2 | 322 | 336 |
| Example 3 | 120 | 136 |
| Example 4 | 102 | 104 |
| Example 5 | 203 | 211 |
| Example 6 | 50 | 67 |
| Example 7 | 26 | 32 |
| Comparative Example 1 | 550 | 568 |
| Comparative Example 2 | 820 | 845 |

EXAMPLE 8

As shown in FIG. 2, an epitaxial layer having a light-emitting nitride device structure was formed on each self-supported GaN substrate 101 obtained in Examples 1 to 7 and Comparative Examples 1 to 2 by a metal-organic chemical vapor deposition (MOCVD) method, to produce an LED device. Trimethyl gallium (TMG), trimethyl aluminum (TMA), trimethyl indium (TMI), and bis(cyclopentadienyl) magnesium (Cp$_2$Mg) were used as organometallic materials, and ammonia (NH$_3$) and silane (SiH$_4$) were used as gas materials. Hydrogen and nitrogen were used as a carrier gas.

First, a 4-μm-thick n-GaN contact layer 102 doped with 1×10$^{19}$ of Si per cm$^3$ was grown on the self-supported GaN substrate 101 at 1050° C. An InGaN active layer 110 having a multiquantum well (MQW) structure constituted by an alternate laminate of three 3-nm-thick quantum well layers 111 each made of In$_{0.1}$Ga$_{0.9}$N and four 10-nm-thick GaN barrier layers 112 was then grown on the contact layer 102 at 800° C. A 30-nm-thick p-Al$_{0.1}$Ga$_{0.9}$N clad layer 121 and a 200-nm-thick p-GaN contact layer 122 were formed in this order on the active layer.

After the wafer having the above layers was taken out of the MOVPE apparatus, a positive electrode 125 containing Ni and Au was formed on the p-GaN contact layer 122, and a negative electrode 124 of Ti and Al was formed on a rear surface of the GaN substrate 101. Finally, the wafer was cut to chips of 350 μm each to provide LED devices. 20 mA of a forward current was supplied to each LED device sample to emit a blue-purple laser beam of 405 nm. The emission power and the driving voltage of each LED device sample are shown in Table 3.

TABLE 3

| | LED Device | | |
| --- | --- | --- | --- |
| Sample No. | Self-Supported GaN Substrate | Emission Power (mW) | Driving Voltage (V) |
| 1 | Example 1 | 5.4 | 3.4 |
| 2 | Example 2 | 5.1 | 3.4 |
| 3 | Example 3 | 6.6 | 3.2 |
| 4 | Example 4 | 7.2 | 3.2 |
| 5 | Example 5 | 6.2 | 3.4 |
| 6 | Example 6 | 7.8 | 3.2 |
| 7 | Example 7 | 8.0 | 3.2 |
| 8 | Comparative Example 1 | 1.8 | 6.4 |
| 9 | Comparative Example 2 | 1.0 | 8.8 |

Figure 3:
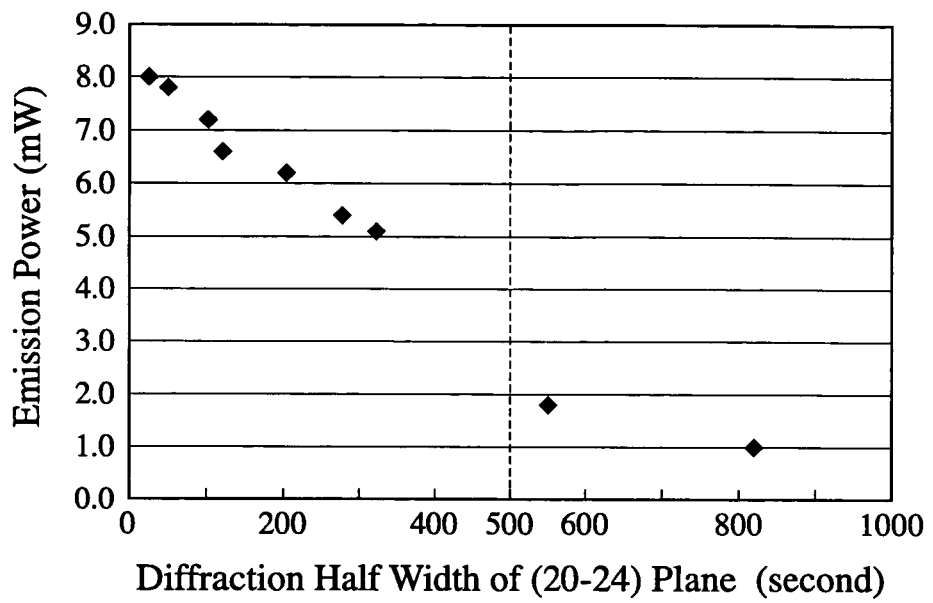
FIG. 3 is a graph showing the relation between an X-ray diffraction half width of a (20-24) plane of each self-supported GaN substrate in Examples 1 to 7 and Comparative Examples 1, 2, and the emission power of each LED device formed on each self-supported GaN substrate.
Figure 4:
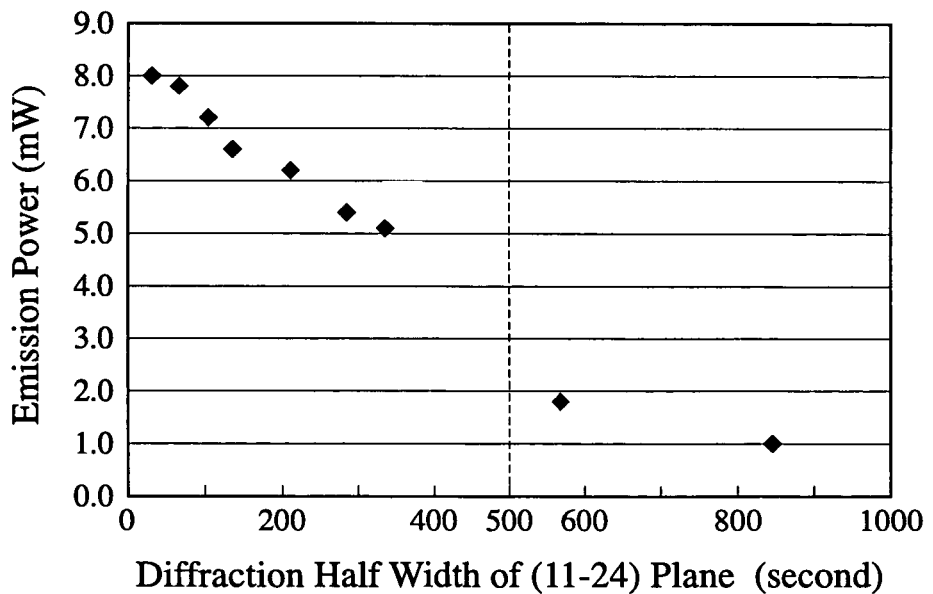
FIG. 4 is a graph showing the relation between an X-ray diffraction half width of a (11-24) plane of each self-supported GaN substrate in Examples 1 to 7 and Comparative Examples 1, 2, and the emission power of each LED device formed on each self-supported GaN substrate.

With respect to each LED device sample of 1 to 9, the relations between the X-ray diffraction half widths of a (20-24) plane and a (11-24) plane and the emission power are shown in FIGS. 3 and 4. It is clear from FIGS. 3 and 4 that the LED devices of Samples 1 to 7, in which the X-ray diffraction half widths of a (20-24) plane and a (11-24) plane of the self-supported GaN substrate had 500 seconds or less, had emission power more than two times that of the LED devices of Samples 8, 9, in which the corresponding X-ray diffraction half widths had more than 500 seconds. The driving voltage of the LED device was high when the self-supported GaN substrate had an X-ray diffraction width of more than 500 seconds in a (20-24) plane and a (11-24) plane.

Using the self-supported nitride semiconductor substrate of the present invention, nitride semiconductor layers with little lattice defects can be grown for devices such as LEDs, LDs, light-receiving devices, etc. with drastically improved characteristics. Light-emitting devices formed by using such self-supported nitride semiconductor substrates can provide high emission power with low driving voltage.

What is claimed is:

1. A self-supported nitride semiconductor substrate having an X-ray diffraction half width of 50 seconds or less in a {20-24} diffraction plane, and a diameter of 10 mm or more and a thickness of 200 μm or more.

2. The self-supported nitride semiconductor substrate according to claim 1, wherein said nitride semiconductor is undoped, or n- or p-type, and has a carrier density of 1×10$^{20}$ cm$^{-3}$ or less.

3. A method for producing a self-supported nitride semiconductor substrate as claimed in claim 1, said method comprising (1) forming a first nitride semiconductor layer having a dislocation density of $10^n/cm^2$ ($0 \leq n \leq 10$) on a base substrate; (2) forming a mask layer made of another material than said nitride semiconductor on said first nitride semiconductor layer; (3) providing said mask layer with openings having an area of $10^{-n}$ cm$^2$ or less, which penetrate said mask layer in a thickness direction, at a density of $10^{n-2}/cm^2$ or less; (4) forming a second nitride semiconductor layer having a thickness of 200 μm or more on said mask layer; and (5) removing said base substrate, said first nitride semiconductor layer, and said mask layer.

4. The method for producing a self-supported nitride semiconductor substrate according to claim 3, wherein said openings were at a density of $10^{n-4}/cm^2$ or less in said mask layer.

5. The method for producing a self-supported nitride semiconductor substrate according to 3, wherein the growing of said nitride semiconductor is carried out by a sublimation method, a metal-organic vapor phase epitaxy method, a hydride vapor-phase epitaxy method, a liquid-phase epitaxy method or a combination thereof.

6. The method for producing a self-supported nitride semiconductor substrate according to claim 3, wherein said base substrate is made of a different material from that of said self-supported nitride semiconductor substrate.

7. The method for producing a self-supported nitride semiconductor substrate according to claim 3, wherein said first nitride semiconductor layer is formed on said base substrate via a buffer layer.

8. A light-emitting nitride semiconductor device comprising an epitaxial nitride layer with a light-emitting device structure formed on a self-supported nitride semiconductor substrate having an X-ray diffraction half width of 50 seconds or less in a {20-24} diffraction plane, a diameter of 10 mm or more and a thickness of 200 μm or more.

* * * * *